United States Patent
Oraw et al.

(10) Patent No.: US 9,397,265 B2
(45) Date of Patent: Jul. 19, 2016

(54) LAYERED CONDUCTIVE PHOSPHOR ELECTRODE FOR VERTICAL LED AND METHOD FOR FORMING SAME

(71) Applicant: Nthdegree Technologies Worldwide Inc., Tempe, AZ (US)

(72) Inventors: Bradley Steven Oraw, Chandler, AZ (US); Reuben Rettke, Phoenix, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/245,471

(22) Filed: Apr. 4, 2014

(65) Prior Publication Data

US 2014/0306244 A1    Oct. 16, 2014

Related U.S. Application Data

(60) Provisional application No. 61/811,885, filed on Apr. 15, 2013.

(51) Int. Cl.
*H01L 33/40* (2010.01)
*H01L 33/42* (2010.01)
(Continued)

(52) U.S. Cl.
CPC .............. *H01L 33/40* (2013.01); *H01L 33/501* (2013.01); *H01L 25/0753* (2013.01); *H01L 33/42* (2013.01);
(Continued)

(58) Field of Classification Search
CPC ......... H01L 33/40; H01L 33/42; H01L 33/50; H01L 33/501; H01L 33/502; H01L 25/0753; H01L 27/153; H01L 2933/0016; H01L 2933/0041
See application file for complete search history.

(56) References Cited

U.S. PATENT DOCUMENTS 4,689,522 A * 8/1987 Robertson ................ G09G 3/30
313/505
5,958,573 A * 9/1999 Spitler et al. .................. 428/323
(Continued)

FOREIGN PATENT DOCUMENTS

| EP | 1770794 A2 | 4/2007 |
|---|---|---|
| JP | 2008098486 A | 4/2008 |
| KR | 20100133565 A | 12/2010 |

OTHER PUBLICATIONS

English Machine Translation of JP2008-098486A of record.*
(Continued)

*Primary Examiner* — Eduardo A Rodela
*Assistant Examiner* — Christopher M Roland
(74) *Attorney, Agent, or Firm* — Patent Law Group LLP; Brian D. Ogonowsky

(57) ABSTRACT

In a method for forming a phosphor-converted LED, an array of vertical LEDs is printed over a conductive surface of a substrate such that a bottom electrode of the LEDs ohmically contacts the conductive surface. A dielectric layer then formed over the conductive surface. An electrically conductive phosphor layer is deposited over the dielectric layer and the LEDs to ohmically contact the top surface of the LEDs and connect the LEDs in parallel. The conductive phosphor layer is formed by phosphor particles intermixed with a transparent conductor material. One or more metal contacts over the conductive phosphor layer conduct current through the conductive phosphor layer and the LEDs to illuminate the LEDs. A portion of light generated by the LED leaks through the conductive phosphor layer, and the combination of the LED light and phosphor light creates a composite light.

7 Claims, 3 Drawing Sheets

(51) Int. Cl.
*H01L 33/50* (2010.01)
*H01L 25/075* (2006.01)

(52) U.S. Cl.
CPC .............. *H01L 33/50* (2013.01); *H01L 33/502* (2013.01); *H01L 2924/0002* (2013.01); *H01L 2933/0016* (2013.01); *H01L 2933/0041* (2013.01)

(56) References Cited

U.S. PATENT DOCUMENTS

| | | | |
|---|---|---|---|
| 8,159,131 B2* | 4/2012 | Helbing | H01L 33/507 313/512 |
| 2002/0074558 A1* | 6/2002 | Hata et al. | 257/89 |
| 2006/0284195 A1* | 12/2006 | Nagai | 257/98 |
| 2007/0080361 A1* | 4/2007 | Malm | B82Y 20/00 257/99 |
| 2008/0297453 A1* | 12/2008 | Ray et al. | 345/82 |
| 2009/0103297 A1 | 4/2009 | Bogner et al. | |
| 2011/0133125 A1* | 6/2011 | Shirata | 252/301.4 R |
| 2012/0164796 A1 | 6/2012 | Lowenthal et al. | |
| 2012/0205695 A1* | 8/2012 | Lin et al. | 257/98 |
| 2012/0248967 A1* | 10/2012 | Li et al. | 313/496 |
| 2013/0032837 A1 | 2/2013 | Kuo et al. | |
| 2013/0258636 A1* | 10/2013 | Rettke | 362/84 |
| 2014/0198373 A1* | 7/2014 | Ray | 359/291 |
| 2014/0231834 A1* | 8/2014 | Lowenthal et al. | 257/88 |
| 2014/0240618 A1* | 8/2014 | Oraw | 349/12 |
| 2014/0355251 A1* | 12/2014 | Kahrs et al. | 362/97.1 |

OTHER PUBLICATIONS

EPO as International Searching Authority for PCT/US2014/033672, "International Search Report and Written Opinion", Mar. 31, 2015, 15 pages.

* cited by examiner

LAYERED CONDUCTIVE PHOSPHOR ELECTRODE FOR VERTICAL LED AND METHOD FOR FORMING SAME

CROSS-REFERENCE TO RELATED APPLICATIONS

This application claims priority to U.S. provisional application Ser. No. 61/811,885, filed on Apr. 15, 2013, by Bradley S. Oraw et al., assigned to the present assignee and incorporated herein by reference.

FIELD OF THE INVENTION

This invention relates to light emitting diodes (LEDs) and, in particular, to a vertical LED die having a conductive phosphor layer as an electrode.

BACKGROUND

Vertical LEDs have a top electrode and a bottom electrode, such as a top anode and a bottom cathode. Current flows vertically through the LED layers to cause photons to be emitted from the active layer.

It is well-known to provide a phosphor on the light-emitting side of the LED die to wavelength-convert the LED light. For example, the phosphor layer may be a YAG phosphor that emits yellow light when energized by a blue light, and the active layer may emit blue light. Some of the blue light leaks through the phosphor layer to combine with the yellow light to create white light. Typically, the phosphor layer is composed of ceramic phosphor particles in a transparent dielectric binder, such as silicone.

The phosphor layer must allow the LED's top metal electrode to be exposed so that a wire can be bonded to the top electrode. This can be done by etching the phosphor layer over the electrode. The top electrode must be made small so as not to block a significant portion of the light, such as a narrow metal ring around the top perimeter of the LED, or patterned to have narrow fingers, etc. A transparent conductor layer may be deposited between the phosphor layer and the LED semiconductor layers to help spread the current laterally from top metal electrode.

One problem with such a configuration is that the interface of the phosphor layer and the transparent conductor layer may result in total internal reflection (TIR) back into the LED, resulting in some absorption by the semiconductor layers. The transparent conductor layer also attenuates the light and thus lowers the conversion efficiency. Another problem is that etching the phosphor layer to expose the top electrode reduces the amount of phosphor available for wavelength conversion and also results in lower color uniformity across the LED. Etching the phosphor also wastes the phosphor and adds an extra step. Further, the top metal electrode blocks some of the LED light.

What is needed is a technique for wavelength-converting LED light using a phosphor that does not have the drawbacks of the above-described devices.

It is known to form an electrically conductive phosphor layer for light-emitting field emission devices (not LEDs), where opposing transparent conductive plates have a high voltage applied to them, and a conductive phosphor layer lines one or both conductive plates. Such a conductive phosphor and field emission device are described in United States publication US 2012/0248967, incorporated herein by reference. The conductive phosphor is pre-formed as a paste using carbon nanotubes, phosphor powder, and a suitable organic vehicle. The paste is then spread on the conductive plate. The organic vehicle is removed by heat during curing. Electrons are drawn by the electric field and energize the phosphor to emit light. However, such phosphors are the types used to convert high energy electrons to light (such as used in CRTs) rather than wavelength-convert visible light and are thus very different from phosphors used in LEDs. Further, the structure is such that there is no blue or visible light that leaks through the phosphor layer that combines with the phosphor light to produce the desired overall light. Further, the phosphor layer is relatively thick and dense to convert a maximum amount of the high energy electrons to photons, making it unsuitable for use with an LED. Accordingly, such conductive phosphors are solely for use in a field unrelated to wavelength conversion for LEDs.

SUMMARY

In one embodiment of the invention, a monolayer of microscopic vertical LED dies is printed as an ink on a reflective first conductive layer. The LEDs are oriented in the same direction, such as with their cathode electrodes ohmically contacting the first conductive layer. A dielectric layer is then printed over the first conductive layer so as to expose the top anode electrodes. An electrically conductive phosphor layer, customized for use with the LEDs, is then printed over the dielectric layer to electrically contact the top anode surface of the LEDs. The LEDs are thus connected in parallel by the conductive phosphor layer. The conductive phosphor layer comprises phosphor particles and a transparent conductor material, used as a binder for the phosphor particles. A suitable voltage applied between the phosphor layer and the first conductive layer illuminates the LEDs. If the LEDs are GaN based and emit blue light, the phosphor layer may include YAG phosphor particles that convert the blue light to yellow light. The conductive phosphor layer is designed to allow a precise amount of the blue light to leak through so that the resulting light is white. The phosphor is designed to be optimally energized by the LED peak emission wavelength. Other types of phosphor and LEDs may be used.

The resulting conductive phosphor layer will typically appear opaque or translucent during its off-state due to the phosphor converting the ambient light to, for example, a yellow color.

In one embodiment, monolayers of phosphor particles (with spaces between the particles) and thin conformal layers of an optically transparent conductor material are alternately printed to precisely control the density and uniformity of the conductive phosphor layer.

In another embodiment, the phosphor particles are printed from one source and the transparent conductor material is printed from another source at the same time and combined over the LEDs.

In another embodiment, the phosphor particles and the transparent conductor material are pre-mixed and deposited by printing or by other methods.

In another embodiment, the phosphor particles and the transparent conductor material are co-sputtered in a dry state, and the transparent conductor material is then melted by heat.

The conductive phosphor layer may be pre-formed as a tile and laminated to the LED surface, such as prior to the LED wafer singulation stage to simplify handling.

In one embodiment, the first conductive layer (contacting the bottom of the LED) may be another transparent conductive phosphor layer, and the LED light exits the lamp from both the anode side and the cathode side.

In another embodiment, the LEDs are not printed and may be conventional.

The transparent conductor material used in the phosphor layer may contain silver nanowires, or indium-titanium-oxide (ITO), or carbon nanotubes, or a conductive polymer (e.g., polyaniline). Such conductor materials are commercially available. The conductor phosphor layer is preferably flexible for use in a thin light sheet, of any size, formed using a printed monolayer of microscopic LED dies over a flexible substrate film.

Accordingly, by using the conductive phosphor layer as an electrode covering a surface of the vertical LED die, no surface area of the phosphor layer needs to be etched to expose an electrode of the vertical LED, and no separate transparent conductor layer is needed to spread current from a metal electrode. Therefore, the efficiency of the lamp is increased and color uniformity across the LED is improved.

BRIEF DESCRIPTION OF DRAWINGS

Elements that are the same or similar in the figures are labeled with the same numeral.

DETAILED DESCRIPTION

Figure 1:
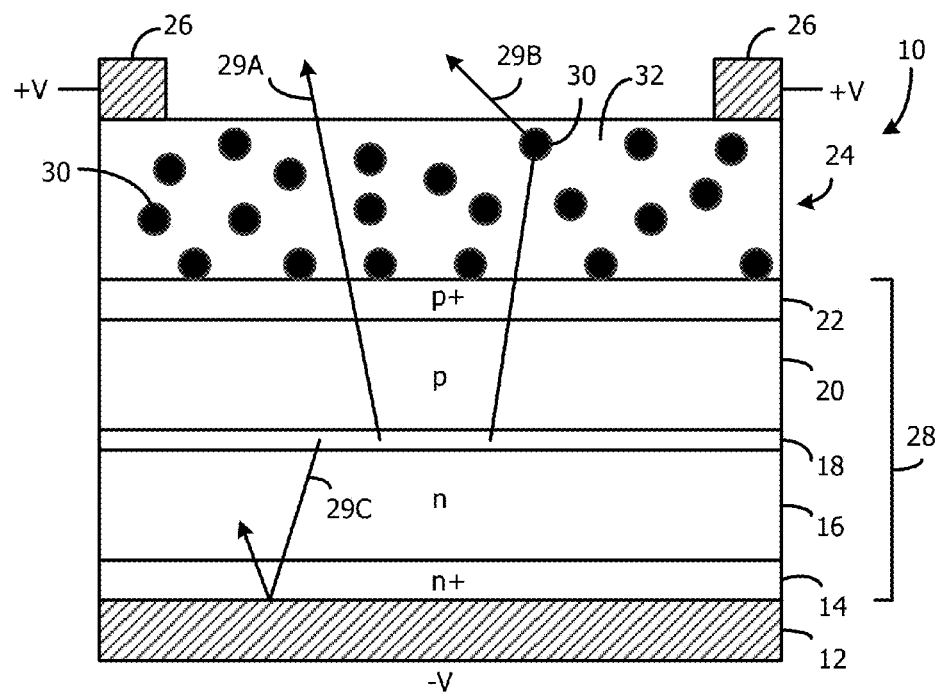
FIG. 1 is a cross-section of a single vertical LED die having a bottom mirror cathode electrode and a top conductive phosphor layer anode electrode, in accordance with one embodiment of the invention. The conductive phosphor layer is designed to leak a precise amount of blue LED light to combine with the phosphor light. The conductive phosphor layer shown may be a small portion of a single, large-area conductive phosphor layer covering an array of LED dies, where a metal contact is formed along one or more edges of the conductive phosphor layer.

FIG. 1 illustrates one embodiment of the invention. An LED die 10 includes a metal mirror cathode electrode 12, an n+ type semiconductor layer 14 for making ohmic contact to the electrode 12, a n-type semiconductor layer 16, and active layer 18 that emits light, a p-type semiconductor layer 20, a p+ type semiconductor layer 22, and a conductive phosphor layer 24 making ohmic contact to the layer 22 and acting as an anode electrode. The phosphor layer 24 may be contacted along its edge with metal contacts 26. The semiconductor portion of the LED die 10 is labeled as the LED portion 28.

The phosphor layer 24 may be a small portion of a single, large-area phosphor layer covering an array of LED dies, where the metal contacts 26 are formed along one or more edges of the phosphor layer for connection to a driving voltage. The growth substrate (e.g., sapphire) for the LED's semiconductor epitaxial layers has been removed, such as by laser lift-off. The LED die 10 may be supported on a substrate, which supports many other LED dies.

In one embodiment, the LED portion 28 and electrode 12 is a microscopic LED die printed by an LED ink over a conductive layer on a substrate, where the ink is then cured (the ink solvent is evaporated). The ink contains millions of the LED dies that have been singulated from an LED wafer. The conductive phosphor layer 24 may be deposited over the LED wafer prior to singulation, or the phosphor layer 24 may be blanket deposited over a printed monolayer of the LED dies.

The conductive phosphor layer 24 comprises phosphor particles 30 of sizes 0.5-30 microns along with a transparent conductor material 32. The phosphor particles 30 may be any color phosphor, such as yellow (YAG), red, green, etc., where the emitted light is combined with the LED light (e.g., blue) to create a desired light emission. The phosphor particles 30 may be generally spherical or irregularly shaped. A narrow particle size distribution is desirable to achieve more uniform coating. However, a wider particle size distribution would achieve a higher 3-dimensional packing density.

The transparent conductor material 32 used in the phosphor layer 24 may comprise silver nanowires in a binder, indium-titanium-oxide (ITO), Al-doped zinc oxides, tin oxides, indium oxides, nickel oxides, carbon nanotubes, or a conductive polymer (e.g., polyaniline). In the example of the silver nanowires, the nanowires are sintered by heating after the phosphor layer 24 is deposited to form a conductive 3-dimensional web of the silver nanowires throughout the phosphor layer 24. Such transparent conductor materials are commercially available. The conductive phosphor layer 24 is conductive in the vertical and lateral directions so as to uniformly spread current over the surface of the LED.

The phosphor layer 24 may be deposited in many different ways, described below. If appropriate, the phosphor layer 24 is cured after deposition to activate the transparent conductor material 32 and evaporate any solvents.

Different light rays 29A, 29B, and 29C are shown, where the light ray 29A leaks through the phosphor layer 24, the light ray 29B is absorbed by a phosphor particle 30 causing it to emit a wavelength-converted light, and the light ray 29C is emitted in a downward direction by the active layer 18 and reflected upward off the mirror cathode electrode 12.

FIGS. 2-5 illustrate a process for alternatively depositing layers of the phosphor particles 30 and the transparent conductor material 32 over a top semiconductor surface of the LED portion 28 to form the conductive phosphor layer 24 having highly controlled characteristics.

The phosphor layer 24 deposition process may be performed over an LED wafer prior to singulation or over a monolayer of singulated LED dies supported on a substrate. The phosphor layer 24 may be a large-area layer over an array of LEDs.

Figure 2:
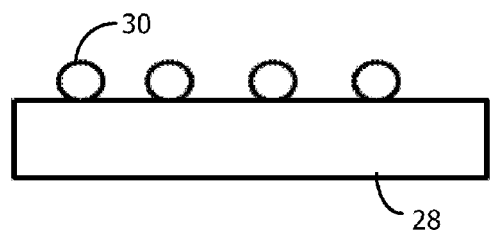
FIGS. 2-5 illustrate a process for alternately depositing a phosphor particle layer and a transparent conductor material layer to form the conductive phosphor layer having highly controlled characteristics.

In FIG. 2, phosphor particles 30 are deposited over the top surface of the LED portion 28, such as by sputtering, spraying, printing, or other chemical or physical deposition method. The phosphor particles 30 may be patterned using a mask or by a printing process. Regions of the phosphor particles 30 may consist of single, poly, or amorphous crystalline particles and the particles may be separated or form an agglomeration of several particles.

Figure 3:
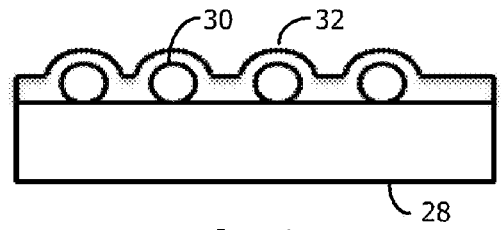

In FIG. 3, a layer of the transparent conductor material 32 is conformally deposited over the phosphor particles 30, such as by printing, spraying, sputtering, etc. If the conductor material 32 is deposited as a dry powder, the powder is liquefied by heat. The conductor material 32 is then cured to harden. The conductor material 32 forms a transparent conductive binder.

Figure 4:
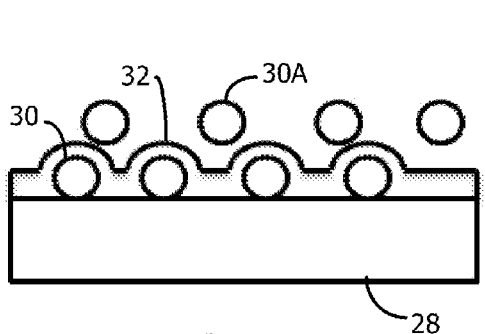

In FIG. 4, another layer of the phosphor particles 30A is deposited. Ideally, the deposited phosphor particles 30A partially fill in the indentations between the phosphor particles 30 in the first layer. This will create more uniform and reproducible color conversion.

Figure 5:
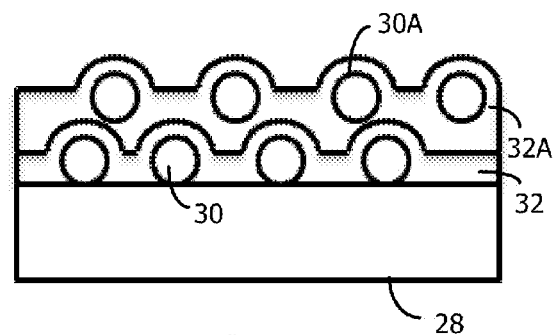

In FIG. 5, another layer of the transparent conductor material 32A is conformally deposited over the phosphor particles 30A, then cured to harden.

The process may be repeated to precisely obtain the required thickness and density of the phosphor layer 24 needed to achieve the target color with good color uniformity across the LED. An average behavior of several layers is more deterministic than a single layer mixture.

If the various layers are patterned, the phosphor particles 30 can be strategically placed from layer to layer (minimizing overlapping of the particles) to maximize Stoke's shift wavelength-conversion efficiency and better control the blue light leakage while minimizing the required thickness of the overall conductive phosphor layer 24. Minimizing the thickness maximizes the transparency and vertical conductivity.

Figure 6:
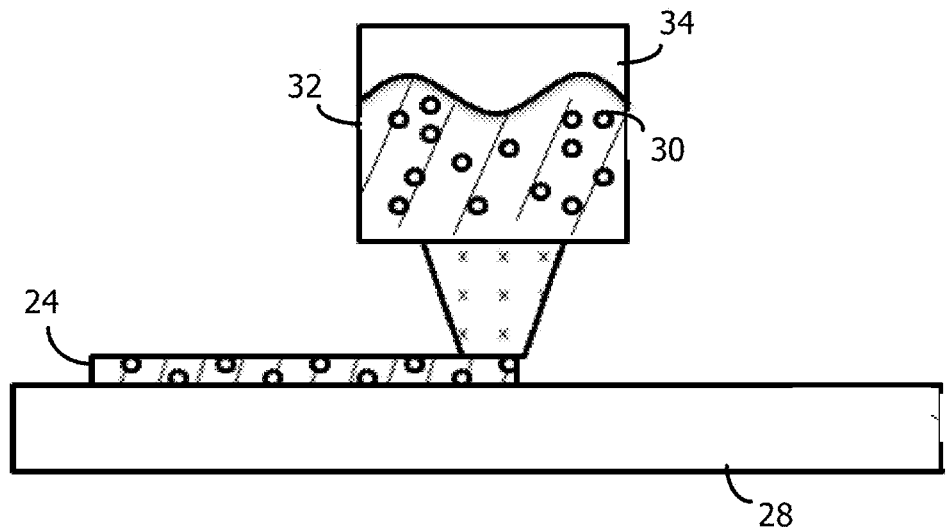
FIG. 6 illustrates printing a mixture of phosphor particles and a transparent conductor material as an ink over the LEDs.

FIG. 6 illustrates printing a mixture (an ink) of phosphor particles 30 and a transparent conductor material 32. Any suitable solvent and viscosity modifier may be added to achieve the desired viscosity. The solvent and viscosity modifier are later evaporated by heat when the mixture is cured. The curing may activate the transparent conductor material 32, such as by sintering metal nanowires in the material 32. A slot die printing process may be used, where a receptacle 34 containing the mixture is scanned over the LED wafer or over an array of LEDs, and the mixture is dispensed via a nozzle having a slot opening perpendicular to the direction of movement. Slot die printing allows the conductive phosphor layer 24 to be precisely patterned, if desired. The printed mixture is then cured.

Alternatively, the ink is screen printed or printed using flexography in a roll-to-roll process. Spin coating may also be used. The ink is then cured to harden.

Figure 7:
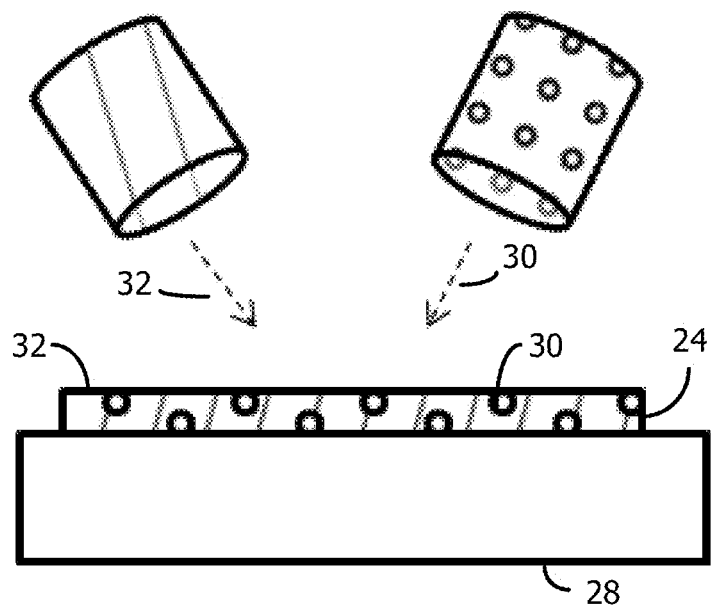
FIG. 7 illustrates depositing phosphor particles and separately depositing a transparent conductor material so that the materials combine over the LEDs.

FIG. 7 illustrates printing, sputtering, or spraying phosphor particles 30 and separately printing, sputtering, or spraying a transparent conductor material 32 so that the materials combine over an LED wafer or over a monolayer of LED dies printed on a substrate. If required, the transparent conductor material 32 is heated to liquefy it to form a continuous electrical path through the conductive phosphor layer 24. The deposited mixture is then cured.

For sputtering, the relative DC or RF power for each sputtering target may be controlled to control the ratio of the materials. Other methods may be used for deposition, such as evaporation and chemical deposition.

In one embodiment, the transparent conductor portion of the phosphor layer 24 may be formed by a very thin layer of a metal such as Ti, Ni, Au, or Pt.

In another embodiment, the conductive phosphor layer 24 may be pre-formed as a thin layer and then laminated over an LED wafer or over an array of printed LEDs. The phosphor layer 24 may then be heated to conform it to the LED surface(s) and create an ohmic connection. For the LED wafer embodiment, the LED wafer is then singulated.

Figure 8:
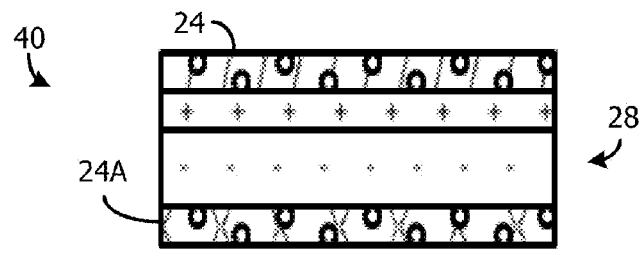
FIG. 8 is a cross-section of a bi-directional LED die having a conductive phosphor layer forming the anode and cathode electrodes.

FIG. 8 is a cross-section of a bi-directional LED die 40 with conductive phosphor layers 24 and 24A forming the anode and cathode electrodes, respectively. The LED semiconductor layers may be the same as shown in FIG. 1. Since there is no mirror layer on the LED die, the light is emitted from both the cathode and anode sides, as well as from the lateral sides.

Figure 9:
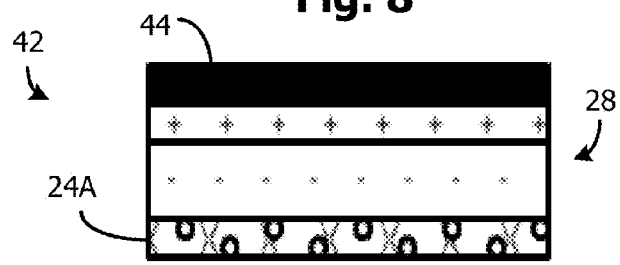
FIG. 9 is a cross-section of a cathode-side emission LED die having a conductive phosphor layer forming the cathode electrode.

FIG. 9 is a cross-section of a cathode-side emission LED die 42 with a conductive phosphor layer 24A forming the cathode electrode. A metal mirror layer 44 forms the anode electrode.

Figure 10:
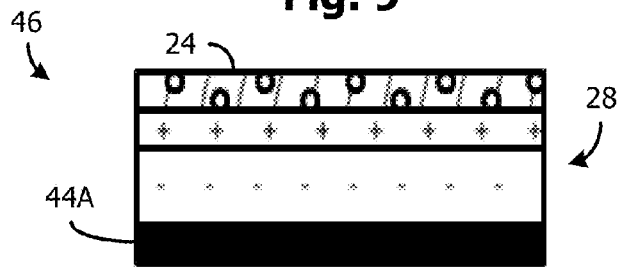
FIG. 10 is a cross-section of an anode-side emission LED die having a conductive phosphor layer forming the anode electrode.

FIG. 10 is a cross-section of an anode-side emission LED die 46 with a conductive phosphor layer 24 forming the anode electrode. A metal mirror layer 44A forms the cathode electrode.

Figure 11:
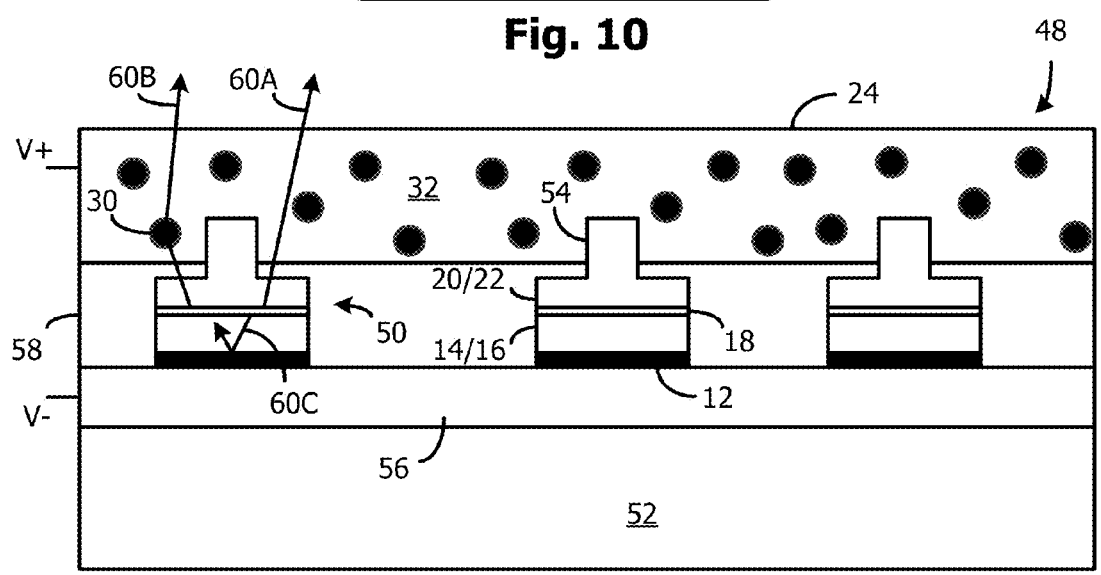
FIG. 11 is a cross-section of a light sheet containing a printed array of LED dies on a substrate, where the conductive phosphor layer forms a large-area anode electrode for the array of LED dies to connect the LED dies in parallel.

FIG. 11 is a cross-section of a small portion of a flexible light sheet 48 containing a printed array of LED dies 50 on a substrate 52, where the conductive phosphor layer 24 forms a large-area anode electrode for the array of LED dies 50. The LED semiconductor layers and mirror cathode electrode 12 may be the same as in FIG. 1. The p-type semiconductor material of the LED is etched during the fabrication of the LED wafer to form a central bump 54, and the top of the bump 54 is metallized prior to singulation from the LED wafer. The bump 54 causes the printed LED dies 50 to be oriented with their cathodes facing downward. The cathode electrode 12 electrically contacts a conductive layer 56 (e.g., aluminum, copper, ITO, an alloy, etc.) deposited or laminated on the thin flexible substrate 52, such as a polycarbonate film.

A dielectric layer 58 is deposited over the conductive layer 56 while still exposing the top of the bumps 54. The dielectric layer 58 naturally de-wets or pulls off from the top of the bump 54. The conductive phosphor layer 24 is then deposited by any of the methods described above to electrically contact the top of the bump 54.

The LED dies 50 are now connected in parallel. A suitable voltage applied between the conductive layer 56 and the conductive phosphor layer 24 causes a vertical current to flow through the correctly-oriented LED dies 50 and illuminates the LED dies 50. Different light rays 60A, 60B, and 60C are shown, where the light ray 60A leaks through the phosphor layer 24, the light ray 60B is absorbed by a phosphor particle 30 causing it to emit a wavelength-converted light, and the light ray 60C is emitted in a downward direction by the active layer 18 and reflects upward off the mirror cathode electrode 12. The conductive layer 56 and the phosphor layer 24 may be electrically coupled to suitable connectors for connection to a power supply.

A large-area light sheet, such as for generating white light for general illumination, may be manufactured in a roll-to-roll process.

Additional detail is provided below regarding the formation of the printable LED ink containing the microscopic LED dies 50 of FIG. 11.

The LED dies 50 are completely formed in an LED wafer by using one or more carrier wafers during the processing to remove the growth substrate and gain access to one or both LED surfaces for metallization. Although the growth substrate may be sapphire for GaN-based LEDs, the carrier wafer may be any material. The LED wafer is affixed to the carrier wafer using an adhesive. The shape of each LED die 50 is defined by masking and etching. The various layers may be doped while being epitaxially grown. After the LED layers are formed on the wafer, trenches are photolithographically defined and etched in the front surface of the wafer around each LED area down to the adhesive layer. A preferred shape of each LED die 50 is hexagonal. The trench etch exposes the underlying wafer bonding adhesive. The adhesive is then dissolved in a solution to release the LED dies 50 from the carrier wafer. Singulation may instead be performed by thinning the back surface of the carrier wafer until the LED dies 50 are singulated. The microscopic LED dies 50 are then uniformly infused in a solvent, including a viscosity-modifying polymer resin, to form an ink for printing, such as screen printing, flexographic printing, or slot die printing.

Details regarding shaping vertical LEDs in a wafer and then singulating the LEDs for printing as an ink are described in US application publication US 2012/0164796, entitled, Method of Manufacturing a Printable Composition of Liquid or Gel Suspension of Diodes, assigned to the present assignee and incorporated herein by reference.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a light generating device comprising:
   providing a vertical light emitting diode (LED) having a first LED surface and an opposing second LED surface; and
   alternating the deposition of phosphor particle layers and transparent conductor material layers over the first surface of the LED, such that gaps between the phosphor particles in a phosphor particle layer allow the transparent conductor material in an overlying transparent conductor layer to be in physical and electrical contact with an underlying transparent conductor layer, wherein each phosphor particle layer comprises a monolayer of phosphor particles;
   wherein the transparent conductor material is in liquid form when the transparent conductor material moves through the gaps between the phosphor particles,
   wherein the phosphor particle layers each contain the same type of phosphor so that each of the phosphor particle layers performs similar wavelength conversion of light from the LED,
   wherein the alternating phosphor particle layers and transparent conductor material layers form an electrically conductive phosphor layer, which conducts current at least vertically through the LED, overlying and in electrical contact with the first LED surface,
   wherein, when the LED is illuminated by applying a voltage across the second LED surface and the conductive phosphor layer, the conductive phosphor layer is configured such that a first portion of light generated by the LED leaks through the conductive phosphor layer, and wherein a second portion of the light generated by the LED energizes the phosphor particles to emit light wavelength-shifted from a peak wavelength of the light generated by the LED such that a composite light is produced.

2. The method of claim 1 wherein providing the LED comprises printing an array of LEDs on a substrate, and wherein depositing the conductive phosphor layer comprises depositing the conductive phosphor layer over the array of LEDs to electrically connect the LEDs in parallel.

3. The method of claim 1 further comprising depositing another electrically conductive phosphor layer overlying and in contact with the second LED surface, wherein the LED emits light bi-directionally.

4. The method of claim 1 wherein the step of depositing the conductive phosphor layer comprises sputtering the phosphor particles over the LED and separately sputtering the transparent conductor material over the LED.

5. The method of claim 1 wherein the step of depositing the conductive phosphor layer comprises:
   depositing a first layer of the phosphor particles over the LED;
   depositing a first layer of the transparent conductor material over the first layer of phosphor particles;
   depositing a second layer of the phosphor particles over the first layer of the transparent conductor material; and
   depositing a second layer of the transparent conductor material over the second layer of phosphor particles.

6. The method of claim 1 further comprising forming at least one metal contact over the top surface of the conductive phosphor layer to conduct current through the conductive phosphor layer and the LED.

7. The method of claim 1 wherein the phosphor particles in each of the phosphor particle layers are patterned during deposition to reduce an amount of overlap of the phosphor particles in consecutive phosphor particle layers to increase wavelength-conversion efficiency and better control leakage of LED light through the phosphor particle layers.

* * * * *